United States Patent [19]

Carobolante

[11] Patent Number: 5,410,190
[45] Date of Patent: Apr. 25, 1995

[54] CIRCUIT FOR SHORTENING THE TURN-OFF TIME OF A POWER TRANSISTOR

[75] Inventor: Francesco Carobolante, San Jose, Calif.

[73] Assignee: SGS-Thomson Microelectronics, Inc., Carrollton, Tex.

[21] Appl. No.: 992,487

[22] Filed: Dec. 17, 1992

[51] Int. Cl.⁶ .................. H03K 3/26; H03K 17/56; H03K 17/687; H03K 17/60
[52] U.S. Cl. .................. 327/110; 327/377; 327/434; 327/482
[58] Field of Search ............... 307/246, 270, 315, 254, 307/571, 573

[56] References Cited

U.S. PATENT DOCUMENTS

| | | | |
|---|---|---|---|
| 4,227,099 | 10/1980 | Houkes | 307/315 |
| 4,636,713 | 1/1987 | Stefani | 307/315 |
| 5,138,515 | 8/1992 | Bourgeois | 307/246 |

FOREIGN PATENT DOCUMENTS

| | | |
|---|---|---|
| 3723581A1 | 3/1988 | Germany . |
| 2152314 | 7/1985 | United Kingdom . |

OTHER PUBLICATIONS

Palmucci, "Switching Regulator With Transistor Turn-off", IBM Technical Disclosure Bulletin, vol. 16, No. 4, Sep. 1973, p. 1161.

*Primary Examiner*—Timothy P. Callahan
*Assistant Examiner*—Trong Phan
*Attorney, Agent, or Firm*—Richard A. Bachand; Lisa K. Jorgenson; Richard K. Robinson

[57] ABSTRACT

A circuit and method for driving an inductive load has a first transistor with a current flow path connected to provide drive current at an output node to the inductive load, and a control element for controlling the current in the first current flow path. The control element is adapted for connection to receive a control signal for turning the current in the first current flow path of the first transistor on and off. A second transistor has a current flow path connected between the output node and the control element of the first transistor, and has a control element for controlling the current in the current flow path. A capacitor is connected between the control element of the second transistor and a reference potential, the capacitor being much larger than an inherent capacitance at the control element of the first transistor divided by a current gain of the second transistor. Finally, a rectifier is connected between the output node of the first transistor and the capacitor. The transistors can be, for example, of NPN, field effect, n-channel MOS, or other transistor construction that can be easily integrated into an integrated circuit chip.

22 Claims, 1 Drawing Sheet

CIRCUIT FOR SHORTENING THE TURN-OFF TIME OF A POWER TRANSISTOR

BACKGROUND OF THE INVENTION

1. Field of the Invention

This invention relates to improvements in transistor circuits, and, more particularly, to improvements in circuits for reducing the turnoff time of power transistors, and still more particularly, to improvements in circuitry for reducing the turnoff time of bipolar transistors used for driving inductive loads, field coils of a dc motor, or the like.

2. Description of the Relevant Art

The problem addressed by this invention is encountered especially in integrated power drivers when used as current sources. Typically, especially in integrated processes, the transistor types used for power handling are either bipolar NPNs or n-channel MOS. When driving an inductive load, or in general, a load which may have any inductive (parasitic) component, a recirculation or freewheeling diode may be provided to supply a path for the load current at turn off.

Thus, with reference to FIG. 1, one prior art circuit embodiment 10 typically may include an NPN transistor 11 that provides drive current to an inductive load 12 and other load circuitry, indicated generally as a box 13. A diode 15 is connected in parallel with the inductive load 12 and other load components 13 to provide a recirculation path for the load current in the coil 12 when the transistor 11 is turned off. Thus, as is known, when the current to the inductive load 12 is turned off, the inductive action of the coil 12 will tend to maintain the current flowing from the emitter connection through the coil 12 and load 13 to ground. This continued current is enabled by the provision of the diode 15.

In a single supply application, turning off the power device may, in fact, be difficult, due to the fact that the load pulls the emitter (or source of an FET) below ground. This renders useless the connection of the power device's base (or gate of an FET) to ground. With reference now to FIG. 2, a circuit similar to the prior art circuit of FIG. 1 is shown, the corresponding parts being denoted by a prime ('). A second NPN transistor 18 is provided with its collector emitter path connected between the base of the NPN transistor 11' and ground. A signal input is provided on the base of the NPN transistor 18 to receive a low-to-high transition signal 20 simultaneously with the high-to-low transitioning signal 21 applied to the base of the NPN transistor 11'. Since the emitter of the NPN transistor 11' is pulled below ground, even the provision of a second NPN transistor 18 to attempt to turn off the first NPN transistor 11' renders operation of the circuit of FIG. 2 undesirably inefficient.

As shown in FIG. 3, the typical solution is the connection of a transistor across the base-emitter (or gate-source of an FET) terminals of the power device, thus shorting them to turn the power device off. The circuit embodiment 10" of FIG. 3 is constructed in a similar fashion to that of the embodiments 10 and 10' of respective FIGS. 1 and 2. The corresponding components of the circuit embodiment 10' are denoted in FIG. 3 by a double prime ("). In the circuit embodiment 10", a second NPN transistor 25 is provided. The collector emitter path of the transistor 25 is connected between the base and emitter of the NPN driver transistor 11". The base of the second NPN transistor 25 receives a control signal. The control signals to the respective bases of NPN transistors 11" and 25 are shown, with the high-to-low transition control pulse 30 that is applied to the base of the NPN transistor 11' falling simultaneously with the change in state from low to high of the control pulse 31 applied to the base of the NPN transistor 25.

Transistor 25, therefore, must be turned on at the instant the biasing of transistor 11" is removed. Unfortunately, particularly in the case of bipolar power transistors, removing the charge stored in its equivalent input capacitance requires the transistor 25 to quickly reach a high conductance state, which in turn requires its input equivalent capacitance to be charged immediately. This is difficult to achieve without expending a lot of current in the circuit that drives the transistor 25.

SUMMARY OF THE INVENTION

In light of the above, therefore, it is an object of the invention to provide an improved technique and circuit for reducing the turn-off time of a power transistor.

It is another object of the invention to provide an improved technique of the type described that reduces or decreases the "shoot-through" current and losses of a power transistor.

It is yet another object of the invention to provide an improved technique and circuit of the type described that reduces power dissipation during switching of a power transistor.

It is still another object of the invention to provide an improved technique and circuit of the type described that improves the ability to drive a power transistor that avoids secondary breakdown problems.

These and other objects, features and advantages of the invention will be apparent to those skilled in the art from the following detailed description of the invention, when read in conjunction with the accompanying drawings and appended claims.

In accordance with a broad aspect of the invention, a circuit for driving an inductive load is presented. The inductive load can be, for example, a coil of a dc motor, or the like. A first transistor has a current flow path connected to provide drive current at an output node to the inductive load, and a control element for controlling the current in the first current flow path. The control element is adapted for connection to receive a control signal for turning the current in the first current flow path of the first transistor on and off. A second transistor has a current flow path connected between the output node and the control element of the first transistor, and has a control element for controlling the current in the current flow path. A capacitor is connected between the control element of the second transistor and a reference potential, the capacitor being much larger than an inherent capacitance at the control element of the first transistor divided by a current gain of the second transistor. Finally, a rectifier is connected between the output node of the first transistor and the capacitor.

The transistors can be, for example, an NPN, field effect, n-channel MOS, or other transistor construction that can be easily integrated into an integrated circuit chip.

In accordance with another broad aspect of the invention, a method for providing drive current to an inductor is presented. According to the method, a capacitor is charged while drive current is being provided by a drive transistor to the inductor. When drive current is desired to be turned off to the inductor, the capacitor is discharged into a control element of a control transistor having a current flow path between the inductor and a control element of the drive transistor to rapidly shut off the drive transistor, and hold the control element of the drive transistor at a potential on the inductor plus any voltage drops across the control transistor.

BRIEF DESCRIPTION OF THE DRAWING

The invention is illustrated in the accompanying drawing in which.

DETAILED DESCRIPTION OF A PREFERRED EMBODIMENT

Figure 4:
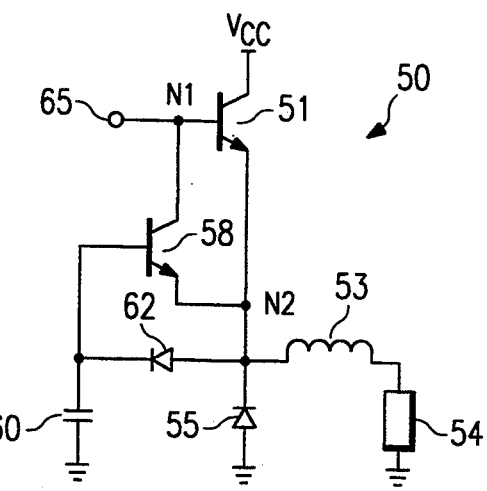
FIG. 4 is an electrical schematic diagram of a circuit employing bipolar NPN transistors for driving an inductive load, in accordance with a preferred embodiment of the present invention.

With reference now to FIG. 4, a driver circuit embodiment 50, in accordance with the invention, is shown. The circuit 50 includes a driver transistor 51 which, preferably, is an NPN type transistor. NPN type transistors are preferred because of their ease of intragratability.

Current flows in the NPN transistor 51 through its collector-emitter path from the voltage supply, $V_{cc}$, to one side of the inductive load 53. As mentioned, the inductive load 53 may be a stator or coil winding of a motor with which the circuit 50 is associated. Additional load components 54 may also exist in series with the current flow path between the coil 53 and a reference potential or ground, as shown.

Figure 1:
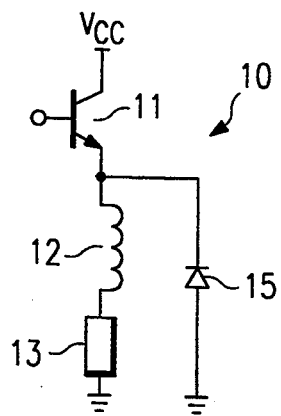
FIGS. 1–3 are electrical schematic diagrams of various bipolar transistor driver circuits for driving an inductive load, in accordance with the prior art.
Figure 2:
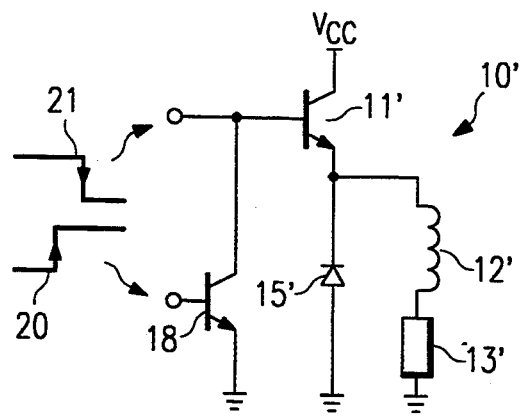
Figure 3:
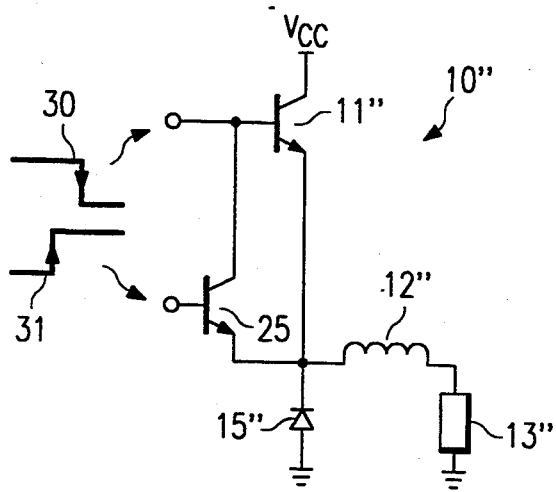

A flyback or current recirculation diode 55, or other device (not shown), may be connected in parallel with the coil 53 and other load elements 54, and functions in a manner similar to that of the diodes 15 described above with reference to the prior art circuit embodiments of FIGS. 1–3.

A second NPN transistor 58 is connected with its collector-to-emitter current flow path between the base and emitter of the driver NPN transistor 51. The base of the second transistor 58 is connected to one side of a capacitor 60. The other side of the capacitor 60 is connected to a reference potential or ground, as shown. A diode 62 is connected between the emitter of the driver NPN transistor 51 and the top side of the capacitor 60 that is connected to the base of the second NPN transistor 58.

In operation, when the driver NPN transistor 51 is conducting, in accordance with the control signal applied to the input node 65 connected to the base of the driver NPN transistor 51, a portion of the drive current normally supplied to the inductive load 53 is diverted by the diode 62 to charge the capacitor 60. When the control signal on node 65 changes state to stop conduction of the driver NPN transistor 51, the charge stored on the capacitor 60 is maintained on the base of the second NPN transistor 58. Thus, when the driver NPN transistor 51 is turned off and its emitter is pulled below ground potential by the action of the inductive load 53, the emitter of the control transistor 58 is pulled low, allowing for the charge stored on the capacitor 60 to quickly flow into its base. The second NPN transistor 58, therefore, will quickly turn on to assure that the charge stored in the base of the driver NPN transistor 51 is quickly removed as the transistor is turned off.

For the circuit to be effective, the capacitor 60 should have a value much larger than $C_{IN2}+C_{IN1}/B2$ where $C_{IN1}$ and $C_{IN2}$ are respectively the equivalent capacitances at nodes N1 and N2 and B2 is the current gain of transistor 58.

Figure 5:
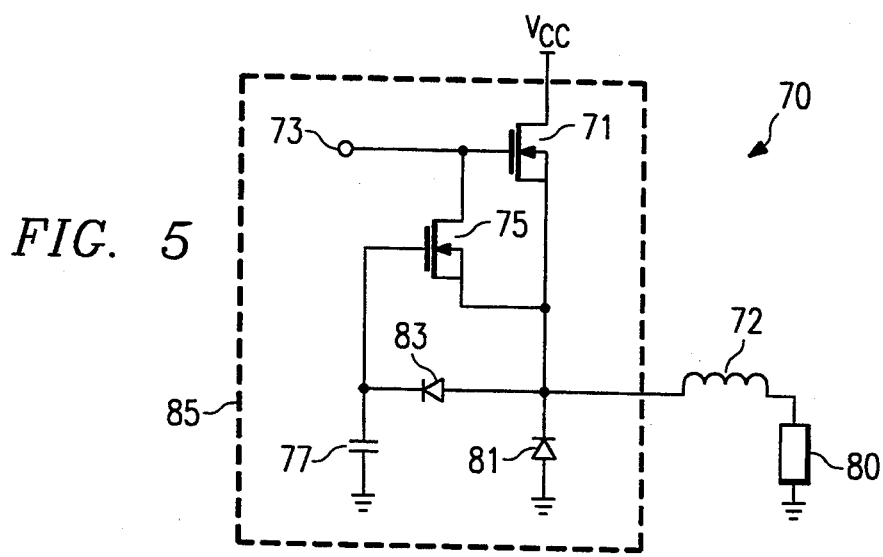
FIG. 5 is an electrical schematic diagram of a circuit for driving an inductive load using n-channel MOS transistors, in accordance with an alternative embodiment of the present invention.

It should be noted that although the circuit embodiment 50 is shown constructed of NPN bipolar transistors, the circuit alternatively could easily be fabricated using field effect transistor devices, and, more particularly, n-channel MOS devices, as shown in FIG. 5. The circuit 70 includes a first n-channel MOS transistor 71 having its drain connected to a supply voltage, $V_{cc}$, its source connected to one end of an inductor 72, and its gate connected to an input node 73. A second n-channel MOS transistor 75 is provided with its drain connected to the gate of the first n-channel MOS device 71, its source connected to the inductor 72, and its gate connected to a capacitor 77. The other end of the capacitor 77 is connected to a reference potential as shown.

The inductor load circuit includes circuitry 80 which may include additional resistive elements or provide additional resistive loading between the inductor 72 and a reference potential as shown. A current recirculation diode 81 is connected in parallel with the inductor 72 and associated load circuitry 80, to provide a current flow path for recirculating current when the n-channel MOS transistor 71 is turned off. Finally, a second diode 83 is connected between the source of the n-channel MOS transistor 71 and the capacitor 77. The diode 83 serves to divert a portion of the current flowing through the n-channel MOS transistor 71 when it is turned on to charge the capacitor 77.

When the n-channel MOS transistor 71 is turned off, the diode 83 blocks the return of the charge that has been built up upon the capacitor 77, whereby the charge is maintained on the gate of the second n-channel MOS transistor 75 to assure its turn on to maintain the gate and source of the first n-channel MOS transistor 71 at approximately the same potential.

The structure surrounded by the dotted line 85 (i.e., less externally connectable elements such as the inductor 72 and resistive components 80) can be easily integrated onto a single integrated circuit chip. The previously described bipolar embodiment can also be easily integrated onto a single integrated circuit chip. The integration of the elements can be accomplished in conjunction with the integration of other components suitable for providing drive signals to coil windings of a dc motor (not shown).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for shortening the turn-off time of a bipolar power transistor, comprising:
   a capacitor;
   a charging circuit connected to divert a portion of a current in said power transistor when said power transistor is turned on, to charge the capacitor;

a second transistor connected between a base and an emitter of said power transistor, said second transistor having a control element, connected to said capacitor such that when said power transistor is turned off, said second transistor controls a voltage between the emitter and base of said power transistor.

2. The circuit of claim 1 wherein said charging circuit comprises a rectifier connected between said capacitor and the emitter of said power transistor to charge said capacitor when the power transistor is on.

3. A circuit for driving an inductive load, comprising:
a first transistor having a first current flow path connected to provide drive current at an output node to the inductive load, and having a control element for controlling the current in said first current flow path, said control element connected to receive a control signal for turning the current in the first current flow path of the first transistor on and off;
a second transistor having a current flow path connected between the output node and the control element of said first transistor, and having a control element for controlling the current in said second current flow path;
a capacitor connected between the control element of said second transistor and a reference potential, said capacitor being much larger than an inherent capacitance at the control element of said first transistor divided by a current gain of the second transistor;
and a rectifier connected between the output node of said first transistor and said capacitor.

4. The circuit of claim 3 wherein said first and second transistors are NPN transistors.

5. The circuit of claim 3 wherein said first and second transistors are N-channel MOS transistors.

6. The circuit of claim 3 wherein said first and second N-channel MOS transistors, said capacitor, and said first diode are formed as a part of an integrated circuit device.

7. The circuit of claim 3 wherein said inductive load comprises coils of a dc motor.

8. The circuit of claim 7 wherein said first transistor is a driver transistor to provide drive current to said motor.

9. A circuit for providing drive current to an inductor, comprising:
a first NPN transistor having a collector connected to a voltage source, an emitter connected to one end of the inductor, and a base for receiving a control signal;
a second NPN transistor having a collector connected to the base of said first NPN transistor, an emitter connected to the emitter of the first NPN transistor, and a base;
a capacitor connected between the base of said second NPN transistor and a reference potential;
and a first diode connected between the emitter of said first NPN transistor and the base of said second NPN transistor to divert a portion of the current flowing from the emitter of said first NPN transistor to charge said capacitor when said first NPN transistor is conducting.

10. The circuit of claim 9 further comprising a second diode connected between the emitter of said first NPN transistor and a reference potential to recirculate current in said inductor when said first NPN transistor is turned off.

11. The circuit of claim 9 wherein said capacitor is larger than an inherent capacitance on the base of said first NPN transistor divided by the current gain of said second NPN transistor.

12. The circuit of claim 9 wherein said inductor is a coil of a dc motor.

13. The circuit of claim 9 wherein said first NPN transistor is a driver transistor to provide drive current to said motor.

14. A circuit for providing drive current to an inductor, comprising:
a first field effect transistor having a drain connected to a voltage source, an source connected to one end of the inductor, and a gate for receiving a control signal;
a second field effect transistor having a drain connected to the gate of said first field effect transistor, a source connected to the source of the first field effect transistor, and a gate;
a capacitor connected between the gate of said second field effect transistor and a reference potential;
a first diode connected between the source of said first field effect transistor and the gate of said second field effect transistor to divert a portion of the current flowing from the source of said first field effect transistor to charge said capacitor when said first field effect transistor is conducting.

15. The circuit of claim 14 further comprising a second diode connected between the source of said first field effect transistor and a reference potential to recirculate current in said inductor when said first field effect transistor is turned off.

16. The circuit of claim 14 wherein said capacitor is larger than an inherent capacitance on the gate of said second field effect transistor.

17. The circuit of claim 14 wherein said field effect transistor is an N-channel MOS transistor.

18. The circuit of claim 17 wherein said first and second field effect transistors, said capacitor, and said first diode are formed as a part of an integrated circuit device.

19. The circuit of claim 14 wherein said inductor is a coil of a dc motor.

20. The circuit of claim 14 wherein said first field effect transistor is a driver transistor to provide drive current to said motor.

21. A method for providing drive current to a load, comprising:
charging a capacitor while drive current is being provided by a drive transistor to one terminal of the load;
when drive current is desired to be turned off to the load, discharging the capacitor into a control element of a control transistor having a current flow path between said one terminal of the load and a control element of the drive transistor to rapidly shut off the drive transistor, and hold the potential of the control element of the drive transistor approximately equal to that of said one terminal of the load.

22. The method of claim 21 wherein said capacitor is charged by providing a rectifier between the load and the capacitor.

* * * * *